United States Patent
Bang et al.

[19]

[11] Patent Number: 6,117,244

[45] Date of Patent: Sep. 12, 2000

[54] DEPOSITION RESISTANT LINING FOR CVD CHAMBER

[75] Inventors: Won B. Bang, San Jose; Ellie Yieh, Millbrae; Thanh Pham, San Jose, all of Calif.

[73] Assignee: Applied Materials, Inc., Santa Clara, Calif.

[21] Appl. No.: 09/047,284

[22] Filed: Mar. 24, 1998

[51] Int. Cl.$^7$ .................................................. C23C 16/00
[52] U.S. Cl. ........................................ 118/715; 156/345
[58] Field of Search ............................. 118/715; 156/345

[56] References Cited

U.S. PATENT DOCUMENTS 5,366,585  11/1994  Robertson et al. ..................... 156/345
5,935,334  8/1999  Fong et al. ............................. 118/723

FOREIGN PATENT DOCUMENTS 0 714 998 A2  6/1996  European Pat. Off. .
0 780 490 A1  6/1997  European Pat. Off. .
0 818 558 A1  1/1998  European Pat. Off. .

*Primary Examiner*—Shrive Beck
*Assistant Examiner*—Sylvia R. MacArthur
*Attorney, Agent, or Firm*—Howrey Simon Arnold & White

[57] ABSTRACT

A deposition resistant lining assembly is provided for a chemical vapor deposition chamber, the deposition resistant lining assembly including a first ceramic liner for mounting adjacent a substrate holder within the chemical vapor deposition chamber to protect a portion of an interior wall of the chemical vapor deposition chamber from deposition of material on the portion of said interior wall of the chemical vapor deposition chamber. The deposition resistant lining assembly also includes a second ceramic liner for mounting in a pumping channel formed in a peripheral region of the chemical vapor deposition chamber to protect a portion of said pumping channel from deposition of the material on the portion of the pumping channel. The first ceramic liner and the second ceramic liner are more resistant to deposition of the material than aluminum and easier and faster to clean of the material deposited thereon than aluminum.

3 Claims, 5 Drawing Sheets

DEPOSITION RESISTANT LINING FOR CVD CHAMBER

BACKGROUND OF THE INVENTION

1. Field of the Invention

This invention relates generally to vacuum processing chambers which are widely used in the semiconductor industry, and in particular to chemical vapor deposition (CVD) processing chambers.

2. Description of the Related Art

The process of depositing layers on a semiconductor substrate (or wafer) in a process chamber by thermal CVD usually involves heating the substrate and holding the substrate a short distance from a source of a stream of gas flowing towards the substrate, a source such as, for example, a gas distribution plate. The flowing gas reacts and deposits a layer on the heated substrate. To aid the deposition on the substrate, the substrate support pedestal (susceptor) may be heated. Heating may be needed to provide reaction energy for the deposition reaction to occur.

A non-uniform gas flow pattern causes undesirable variations in the uniformity of the layer deposited across the surface of the substrate. Typically, an exhaust port extending from the process chamber to a vacuum pump leads to asymmetry in the gas flow pattern. In an attempt to restore symmetry, many designs provide a pumping channel in, or adjacent to, the chamber that surrounds the substrate. However, in many configurations, symmetry is not possible because complete encirclement of the substrate is not possible due to interfering structures, e.g., the substrate insertion opening through which a robot arm passes the substrate into the chamber. Such chambers cannot achieve as high a gas flow symmetry as would be desired on the substrate.

The configuration of the pumping channel and its lack of symmetry about the center of the substrate being processed affect the location at which orifices can be placed and constrain the design based on the need to avoid other structures and passages in the chamber, e.g., the substrate insertion and removal opening and the substrate's path into and out of the chamber. In many instances, the orifices to the pumping channel are configured in the chamber at locations that provide a less than ideal gas flow regime from the gas distribution plate to the pumping channel. Greater deposition takes place where the greater number of reactants contact the substrate surface, i.e., around the orifices. The process gas flow resulting from such a configuration includes small but measurable variations in the thickness of the material deposited on the substrate.

During CVD processing, ideally, the injected process gas would react and deposit a layer only on the substrate surface; however, in reality, some gas molecules miss the substrate surface and deposition occurs on process chamber surfaces other than the surface of the substrate. All chamber surfaces inside the processing chamber are susceptible to being coated by the constituents of the process gas.

When the build-up of deposits on the inside of the processing chamber surfaces becomes thick, flakes or particles of the deposited material can fall from the surface of the chamber onto the substrate being processed, potentially causing a defect. To avoid this problem the inside surfaces of the processing chamber are periodically cleaned by etching (and/or plasma cleaning) the inside surfaces of the processing chamber to remove the deposited material.

It is difficult to evaluate the surface coating conditions inside the chamber. This makes it difficult to detect when the thickness of the coating on the inside surface of the processing chamber is built up to a point where cleaning needs to be done. Determining an optimum need-to-clean point is a trial and error process which requires reliance on historical data rather than direct measurement or observation. Optimization involves extending the time between cleanings as much as possible without introducing defects, since cleaning interferes with normal production processing.

Erosion, wear, and nodule growth on an anodized aluminum pedestal surface takes place in the chamber as the porous and sometimes nonuniform anodized layer on the susceptor's surfaces is repeatedly exposed to the severe conditions present during substrate processing and during cleaning, especially during cleaning using cleaning gases containing fluorine. Furthermore, variations in the quality of anodization or other corrosion-resistant coating on the susceptor can result in undesirable differences in electrical and chemical (insulating) properties across the susceptor which can contribute to non-uniform deposition on the substrate (wafer) surface.

Bare aluminum surfaces are also used for the susceptor. However, such surfaces are subject to attack from fluorine-containing cleaning gas that results in an aluminum fluoride (AlF) film growth that causes process parameters to drift. To recover the process, the susceptor surface is often scraped. The aluminum fluoride (AlF) film is subject to cracking and peeling causing particle contamination.

At some point in the vacuum line between the chamber and the vacuum pump, a vacuum shut-off valve typically is provided which when closed acts as a limit of the process chamber containment. Volatile contaminants which are maintained in their vapor state under the high temperatures of an active processing chamber can and do undesirably condense on the walls of the cool vacuum piping at some distance from the processing area of the processing chamber, but still within the containment limit of the processing chamber defined by the vacuum valve. During no-flow conditions, these contaminants can migrate back into the processing part of the chamber to undesirably contribute to its contamination.

Other sources of contamination in the conventional design are electrical connectors and threaded mechanical fasteners within the process chamber vacuum environment. Turning and tightening of the threaded fasteners, or arcing at the electrical connectors, generates contaminants which may find their way to the substrate and contaminate it. To minimize the effect of contamination in the actual process setting, a procedure which is often used after a processing chamber has been reassembled is to process a number of sample substrates (for example, ten, twenty or thirty) until measurements show that process conditions in the processing chamber have stabilized and that any contaminants introduced as a result of the disassembly and reassembly of the processing chamber have been eliminated. This procedure undesirably prolongs the time needed to begin normal processing once a chamber has been re-assembled.

The present invention is directed to overcoming, or at least reducing the effects of, one or more of the problems set forth above.

SUMMARY OF INVENTION

In one aspect of the present invention, a deposition resistant lining assembly is provided for a chemical vapor deposition chamber, the deposition resistant lining assembly including a first ceramic liner for mounting adjacent a substrate holder within the chemical vapor deposition chamber to protect a portion of an interior wall of the chemical vapor deposition chamber from deposition of material on the portion of said interior wall of the chemical vapor deposition chamber. The deposition resistant lining assembly also includes a second ceramic liner for mounting in a pumping channel formed in a peripheral region of the chemical vapor deposition chamber to protect a portion of said pumping channel from deposition of the material on the portion of the pumping channel. The first ceramic liner and the second ceramic liner are more resistant to deposition of the material than aluminum and easier and faster to clean of the material deposited thereon than aluminum.

In another aspect of the present invention, a chemical vapor deposition reactor system is provided having such a deposition resistant lining assembly. In yet another aspect of the present invention, a method of chemical vapor deposition using such a deposition resistant lining assembly is provided. In still another aspect of the present invention, a method of chemical vapor deposition is provided using the coating of surfaces of a vacuum chamber of a chemical vapor deposition reactor system with a deposition resistant ceramic lining in order to protect a portion of an interior wall of the vacuum chamber from deposition of material on the portion of the interior wall of the vacuum chamber and also to protect a portion of a pumping channel formed in a peripheral region of the vacuum chamber from deposition of the material on the portion of said pumping channel. Such a deposition resistant ceramic lining is more resistant to deposition of the material than aluminum and easier and faster to clean of the material deposited thereon than aluminum.

BRIEF DESCRIPTION OF THE DRAWINGS

Other objects and advantages of the invention will become apparent upon reading the following detailed description and upon reference to the drawings in which.

Figure 1:
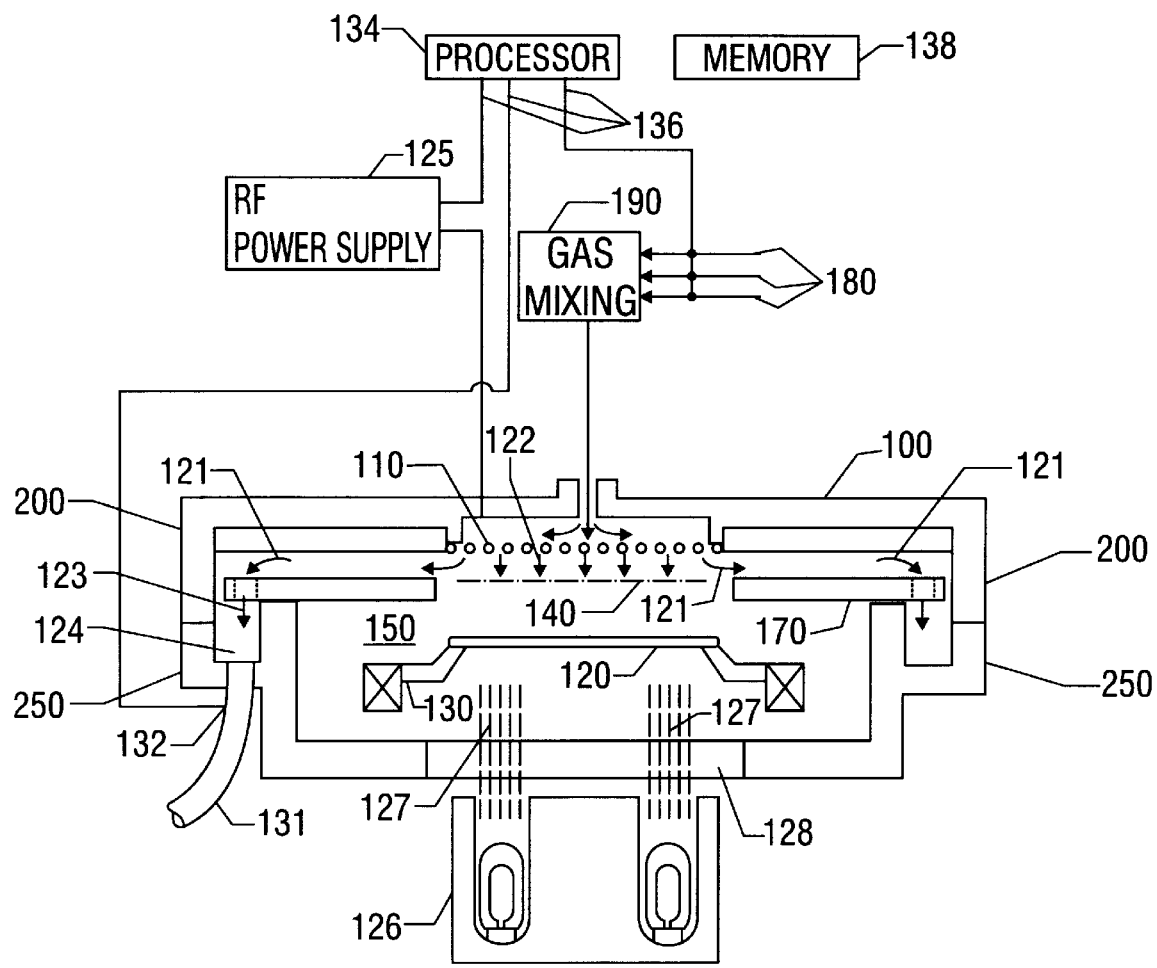
FIG. 1 is a vertical, cross-sectional view of a simplified, parallel plate chemical vapor deposition reactor that may be used with embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and in particular to FIG. 1, an exemplary CVD reactor system is shown. Such a CVD reactor system may be suitable for depositing a boron phosphorus silicate glass (BPSG) layer, for example. FIG. 1 shows a vertical, cross-sectional view of a simplified, parallel plate chemical vapor deposition system 100 having a vacuum chamber 150. The CVD system 100 contains a gas inlet manifold 110 for dispersing deposition gases to a substrate (not shown) that rests on a susceptor 120. Susceptor 120 is highly thermally responsive and is mounted on a support fingers 130 so that susceptor 120 (and the substrate supported on the upper surface of susceptor 120) can be controllably moved between a lower loading/off-loading position and an upper processing position 140 which is closely adjacent manifold 110.

Figure 2:
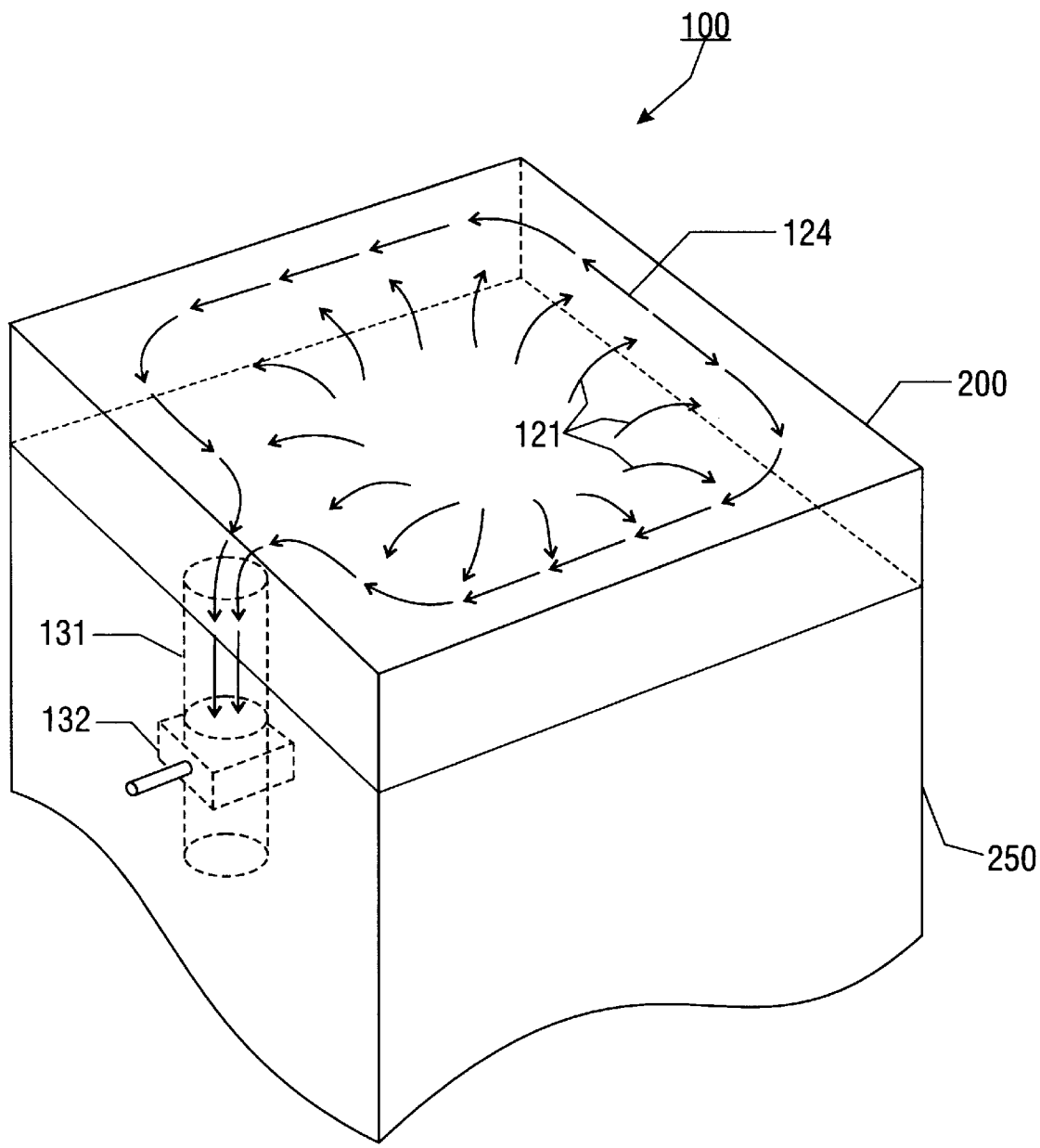
FIG. 2 is a schematic perspective view showing exemplary gas flows in the reactor of FIG. 1 and showing an embodiment of the present invention.

When susceptor 120 and the substrate are in processing position 140, they are surrounded by a baffle plate 170 having a plurality of spaced holes 123 which exhaust into an annular vacuum manifold or pumping channel 124. The pumping channel 124 may be formed at the junction of the lid 200 of the CVD system 100 with the walls 250 of the vacuum chamber 150 (FIG. 1), as indicated schematically also in FIG. 2. Process gases are supplied through gas lines 180 into a mixing chamber 190 where they are combined and then sent to manifold 110. During processing, gas supplied to manifold 110 is uniformly distributed across the surface of the wafer as indicated by arrows 122. The gas is then exhausted via ports 123 into the circular vacuum manifold or pumping channel 124, as indicated by arrows 121, and out an exhaust line 131, as shown in FIG. 2, by a vacuum pump system (not shown). The rate at which gases are released through exhaust line 131 is controlled by a throttle valve 132, also shown schematically, in phantom, in FIG. 2.

The deposition process performed in CVD system 100 (FIG. 1) can be either a thermal process or a plasma enhanced process. In a plasma process, a controlled plasma is formed adjacent to the substrate by RF energy applied to inlet manifold 110 from RF power supply 125. Inlet manifold 110 is also an RF electrode, while susceptor 120 is grounded. RF power supply 125 can supply either single or mixed frequency RF power to manifold 110 to enhance the decomposition of process gases introduced into chamber 150 into reactive species.

An external lamp module 126 provides a collimated annular pattern of light 127 through quartz window 128 onto an annular outer peripheral portion of susceptor 120. Such heat distribution compensates for the natural heat loss pattern of the susceptor 120 and provides rapid thermal and uniform susceptor 120 and substrate heating for effecting deposition.

A motor, not shown, raises and lowers susceptor 120 between processing position 140 and a lower, substrate-loading position. The motor, gas supply valves connected to gas lines 180, throttle valve 132 and RF power supply 125 are controlled by a processor 134 over control lines 136 of which only some are shown. Processor 134 operates under the control of a computer program stored in a memory 138. The computer program dictates the timing, mixture of gases, chamber 150 pressure, chamber 150 temperature, RF power levels, susceptor 120 position, and other parameters of a particular process.

Typically, any or all of the chamber 150 lining, gas inlet manifold 110 faceplate, support fingers 130, and various other reactor hardware is made out of material such as anodized aluminum. An example of such a CVD apparatus is described in U.S. Pat. No. 5,000,113 entitled "Thermal CVD/PECVD Reactor and Use for Thermal Chemical Vapor Deposition of Silicon Dioxide and In-situ Multi-step Planarized Process," issued to Chang et al. and assigned to Applied Materials, Inc., the assignee of the present invention, which is incorporated herein by reference for all purposes.

Figure 3:
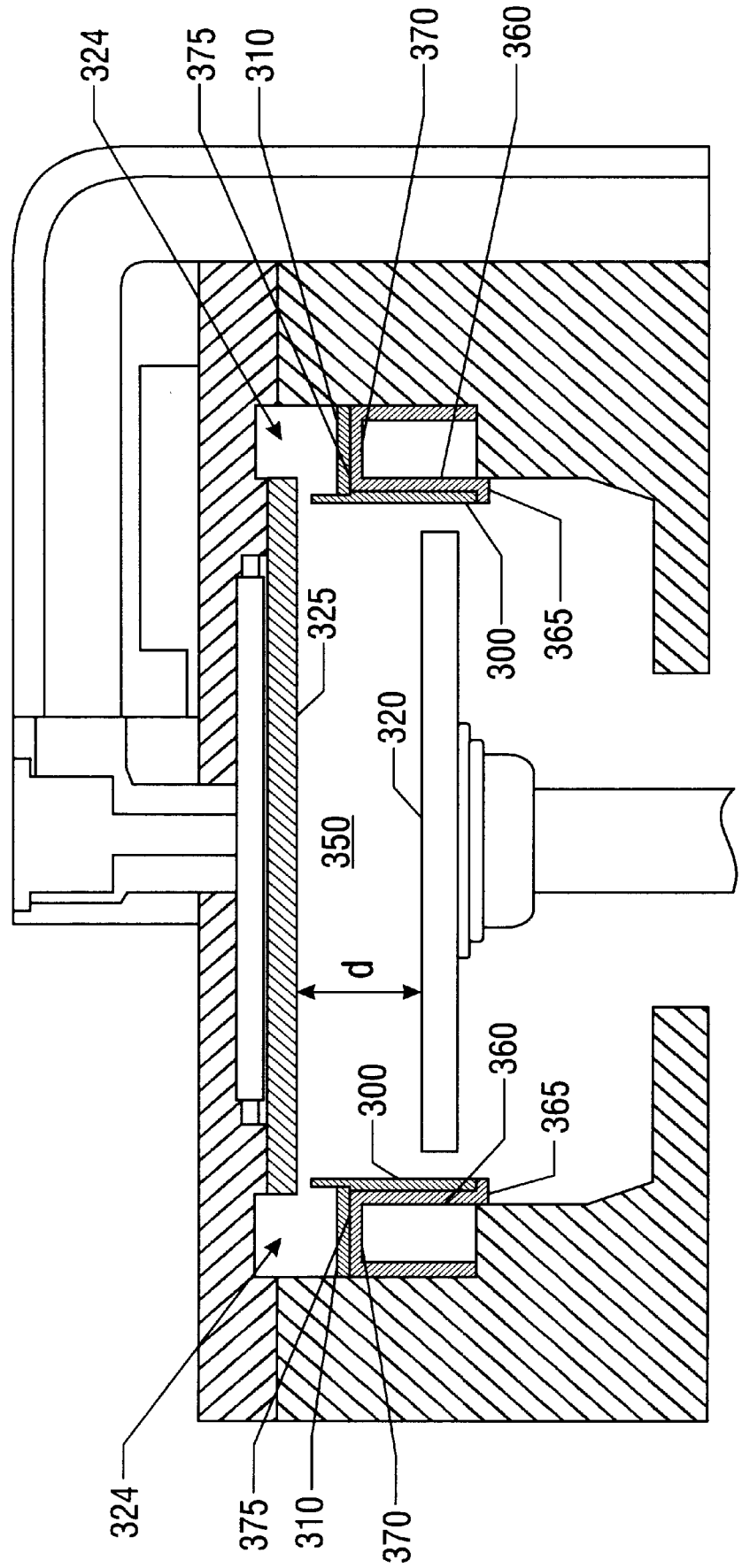
FIG. 3 is a vertical, cross-sectional view of a parallel plate chemical vapor deposition reactor showing an embodiment of the present invention.

Turning now to FIG. 3, a vertical, cross-sectional view of a CVD apparatus illustrating an embodiment of the present invention, a generally cylindrical deposition resistant liner 300 is shown mounted adjacent a heated substrate holder or susceptor 320 (similar to susceptor 120 shown in FIG. 1) at the periphery of the heated substrate holder or susceptor 320. Also shown is a generally annular deposition resistant liner 310 mounted to cover the bottom of a pumping channel 324 (similar to pumping channel 124 shown in FIGS. 1 and 2). The deposition resistant liners 300 and 310 may be made of a ceramic, such as aluminum oxide ($Al_2O_3$), as shown in FIG. 3, or aluminum nitride (AlN), for example. Aluminum oxide may be preferable since aluminum nitride may be about ten times more expensive. The thickness of deposition resistant liner 300 made of $Al_2O_3$ may be about 0.2 inches (0.6 cm) or so, and the diameter of deposition resistant liner 300 may be about 9 inches (23 cm) or so. The thickness of deposition resistant liner 310 made of $Al_2O_3$ may be about 0.1 inches (0.25 cm) or so. The distance d from a faceplate 325 to a substrate or wafer (not shown) where processing occurs on susceptor 320 may be about 0.6 inches (1.5 cm) or so. The generally cylindrical deposition resistant liner 300 may be mounted, for example, by resting on the ledge flange 365 of the aluminum wall portion 360. The generally annular deposition resistant liner 310 may be mounted, for example, by resting on the top surface 375 of the aluminum portion 370 at the bottom of the pumping channel 324.

All inner surfaces of vacuum chamber 350 (similar to vacuum chamber 150 shown in FIG. 1) may be lined or coated with aluminum oxide, but that may be quite expensive. Lining or coating selected portions of the inner surfaces of vacuum chamber 350, such as the aluminum wall portion 360 around the periphery of susceptor 320 and the aluminum portion 370 at the bottom of pumping channel 324, for example, as shown in FIG. 3, is much more feasible, affordable and, hence, preferable.

It is believed that dielectric deposition materials such as silicon dioxide ($SiO_2$), for example, are easier and faster to clean off the surface of a ceramic liner or shield than off a bare aluminum surface not covered by a ceramic liner or shield. Dielectric deposition materials such as $SiO_2$, for example, are believed to stick to and adhere to a bare aluminum surface more strongly than to the surface of a ceramic liner or shield. This is believed to make bare aluminum surfaces harder to clean of the deposition materials deposited thereon. Such cleaning of the deposition materials deposited on a bare aluminum surface is believed to take longer than the cleaning of such deposition materials deposited on a ceramic liner or shield. Further, bare aluminum surfaces may also be used for the heated susceptor 320.

However, such heated aluminum surfaces are subject to fluorine gas attack which results in an aluminum fluoride (AlF) film growth on these and other bare aluminum surfaces, at temperatures of about 600° C. typically used in certain subatmospheric CVD (SACVD) processes, causing process parameters to drift. The fluorine gas may be a contaminant left behind after the evacuation and exhausting of a fluorine-containing cleaning gas. It is believed that AlF grows less on a ceramic liner or shield made of $Al_2O_3$ or AlN than on bare aluminum at temperatures of about 600° C. typically used in certain SACVD processes, causing less drift in the process parameters when ceramic liners or shields cover aluminum surfaces, as shown in FIG. 3, for example. Alternatively, aluminum nitride (AlN) surfaces may also used for the heated susceptor 320, for example.

Figure 4:
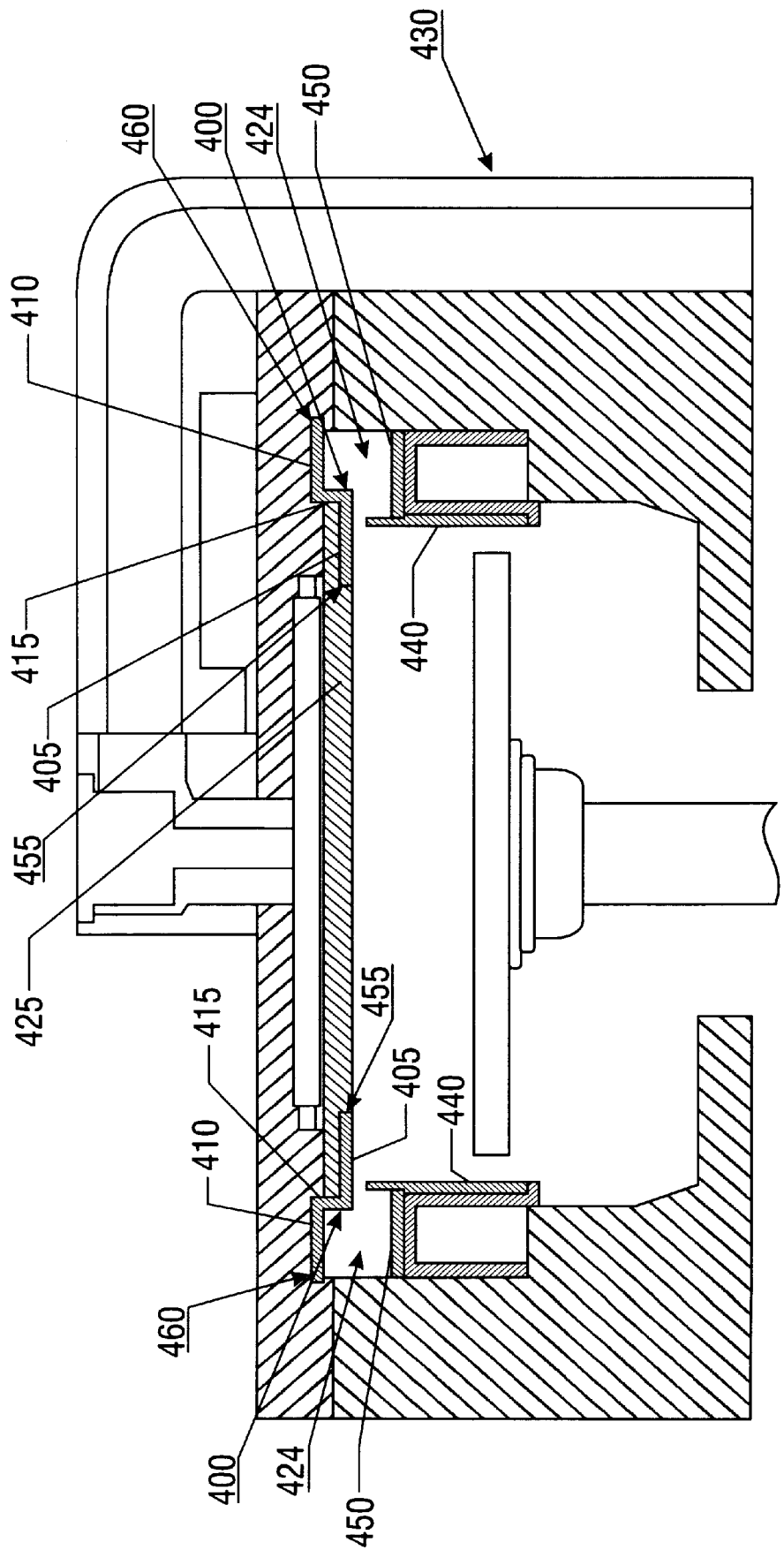
FIG. 4 is a vertical, cross-sectional view of a parallel plate chemical vapor deposition reactor showing another embodiment of the present invention.

Turning now to FIG. 4, a vertical, cross-sectional view of a CVD apparatus illustrating another embodiment of the present invention, a deposition resistant liner 400 having two generally annular liner flanges 405 and 410 attached to a generally cylindrical portion 415 is shown mounted at the periphery or side of a faceplate 425 attached to lid 430. As shown in FIG. 4, liner flange 405 covers a peripheral edge portion of faceplate 425, while liner flange 410 covers an upper portion of a pumping channel 424 (similar to pumping channel 124 shown in FIGS. 1 and 2 and to pumping channel 324 shown in FIG. 3). The deposition resistant liner 400 may also be made of a ceramic, such as aluminum oxide ($Al_2O_3$) or aluminum nitride (AlN), for example. Aluminum oxide may again be preferable since aluminum nitride may be about ten times more expensive. In addition, optional deposition resistant linings 440 and 450, as shown in FIG. 4, may be used, similar to the use of deposition resistant linings 300 and 310, as shown in FIG. 3. The deposition resistant liner 400 may be mounted to the faceplate 425 and the top of the pumping channel 424, for example, by fitting the edges of the two generally annular liner flanges 405 and 410 into the notches 455 and 460, respectively. The notch 455 may be formed in the faceplate 425 and the notch 460 may be formed in the top of the pumping channel 424, for example, as shown in FIG. 4.

Figure 5A:
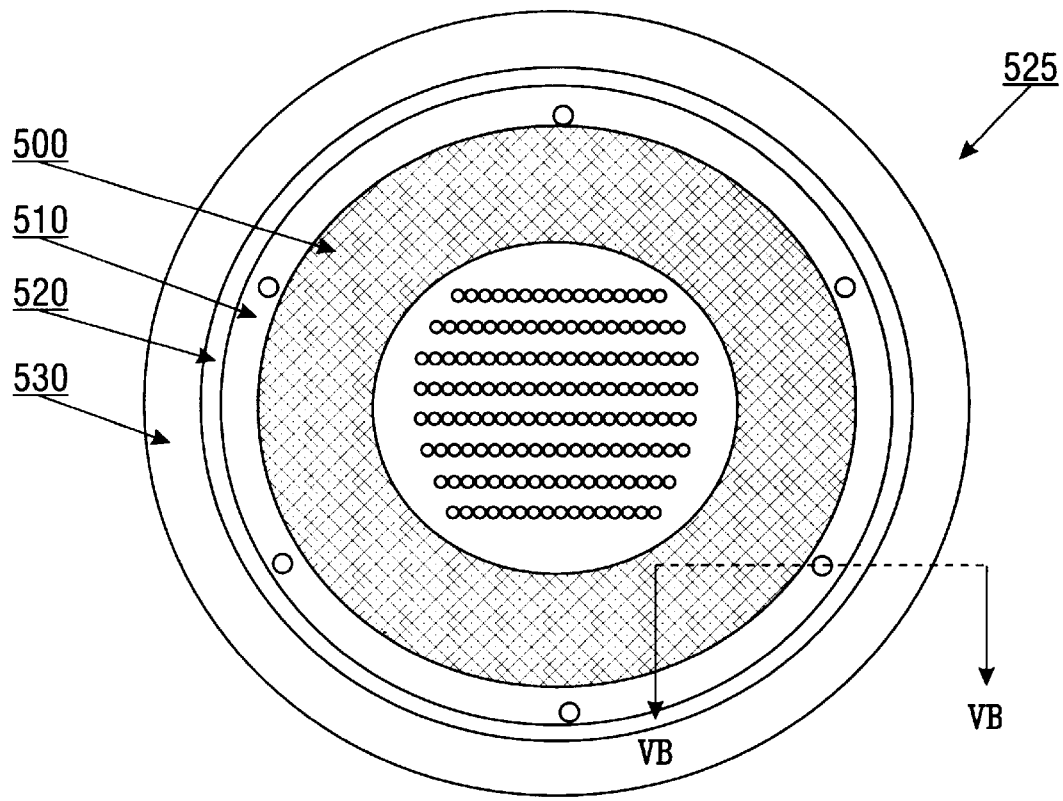
FIGS. 5A and 5B are, respectively, a plan view of a faceplate and a cross-sectional view taken along line VB—VB, showing yet another embodiment of the present invention.
Figure 5B:
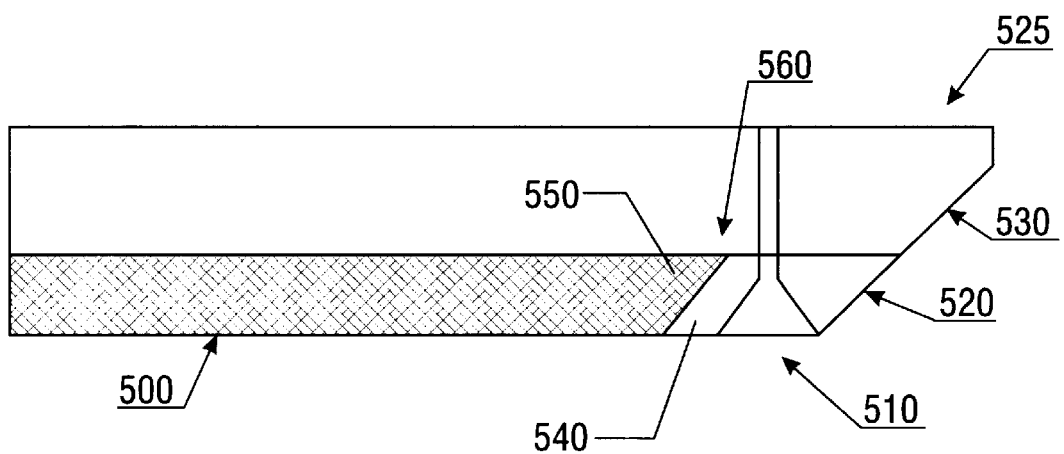

Turning now to FIG. 5A, a plan view of a faceplate 525 showing yet another embodiment of the present invention, a generally annular deposition resistant liner 500 is shown mounted in the periphery of a faceplate 525 (similar to faceplate 425 shown in FIG. 4). The deposition resistant liner 500 is mounted inside of an edge ring 510 separated by a slant portion 520 of the faceplate 525 from a pumping channel surface portion 530 of the faceplate 525. FIG. 5B shows a cross-sectional view taken along line VB—VB in FIG. 5A. The deposition resistant liner 500 may also be made of a ceramic, such as aluminum oxide ($Al_2O_3$) or aluminum nitride (AlN), for example. Aluminum oxide may again be preferable since aluminum nitride may be about ten times more expensive. As shown in FIG. 5B, the deposition resistant liner 500 may be mounted inside of the edge ring 510, for example, by resting on the slanting flange portion 540, with the edge portion 550 of the deposition resistant liner 500 inserted in the notch 560 formed in the faceplate 525. The notch 560 may be similar to the notches 455 and 460 formed, respectively, in the faceplate 425 and the top of the pumping channel 424, for example, as shown in FIG. 4.

The cleaning time for a CVD chamber such as the one shown in FIG. 3, for example, for a silicon oxide gas in a nitrogen ($N_2$) carrier gas at about 600° C. may be about 58–60 seconds with the deposition resistant linings 300 and 310 in place, as shown in FIG. 3. By way of contrast, and for the sake of comparison, the comparison cleaning time for a CVD chamber, such as the one shown in FIG. 3, except without the deposition linings 300 and 310 in place, again for a silicon oxide gas in a nitrogen ($N_2$) carrier gas at about 600° C., may be about 90 seconds or more without any deposition resistant linings in place.

Similarly, the cleaning time for CVD chambers such as the ones shown in FIGS. 3 and 4, for example, for a silicon oxide gas in a helium (He) carrier gas at about 550° C. may be about 85 seconds with the deposition resistant linings 300 and 310 in place, as shown in FIG. 3, and/or with deposition resistant linings 400, 440 and/or 450 in place. By way of contrast, and for the sake of comparison, the comparison cleaning time for a CVD chamber, such as the one shown in FIG. 3, except without the deposition linings 300 and 310 in place, again for a silicon oxide gas in a helium (He) carrier gas at about 550° C., may be about 135 seconds or more without any deposition resistant linings in place.

The above CVD system descriptions are mainly for illustrative purposes and should not be considered as limiting the scope of the present invention. Variations of the above-described systems, such as variations in platen and/or susceptor design, heater design, location of RF power connections, if any, and others are possible. For example, instead of, and/or in addition to, an RF power supply, a microwave power supply may be used to supply microwave energy into a CVD system during a cleaning step when a thermal deposition process is performed in the CVD system.

In another alternative embodiment, substrate heating may be effected, for example, by a heater disposed in the pedestal upon which a substrate (or wafer) is placed, the heater having a heating element therein. Additionally, other CVD equipment such as other SACVD devices, inductively coupled plasma CVD devices, electron cyclotron resonance (ECR) plasma CVD devices or the like may be employed.

What is claimed is:

1. A chemical vapor deposition apparatus comprising:

a chamber defined by a lower surface, side surfaces extending upward from said lower surface, and an upper surface, said upper surface including a faceplate opposite said lower surface;

a ceramic liner contained within a recess of said faceplate, a periphery of said recess being defined by an edge ring, said ceramic liner having a composition more resistant to deposition of material during chemical vapor deposition processing than aluminum and easier and faster to clean of said material deposited thereon than aluminum.

2. The chemical vapor deposition apparatus of claim 1, wherein said ceramic liner includes aluminum oxide.

3. The chemical vapor deposition apparatus of claim 1, wherein said ceramic liner includes aluminum nitride.

* * * * *